(12) United States Patent
Fukazawa et al.

(10) Patent No.: US 7,582,575 B2
(45) Date of Patent: Sep. 1, 2009

(54) METHOD FOR FORMING INSULATION FILM

(75) Inventors: Atsuki Fukazawa, Tama (JP); Kenichi Kagami, Tama (JP)

(73) Assignee: ASM Japan K.K., Tokyo (JP)

( * ) Notice: Subject to any disclaimer, the term of this patent is extended or adjusted under 35 U.S.C. 154(b) by 392 days.

(21) Appl. No.: 11/294,319

(22) Filed: Dec. 5, 2005

(65) Prior Publication Data

US 2006/0110931 A1 May 25, 2006

Related U.S. Application Data

(63) Continuation-in-part of application No. 10/412,363, filed on Apr. 11, 2003, now Pat. No. 7,064,088, which is a continuation-in-part of application No. 10/317,239, filed on Dec. 11, 2002, now Pat. No. 6,881,683, which is a continuation-in-part of application No. 09/827,616, filed on Apr. 6, 2001, now Pat. No. 6,514,880, and a continuation-in-part of application No. 09/691,376, filed on Oct. 18, 2000, now Pat. No. 6,432,846, and a continuation-in-part of application No. 09/326,847, filed on Jun. 7, 1999, now Pat. No. 6,352,945, and a continuation-in-part of application No. 09/326,848, filed on Jun. 7, 1999, now Pat. No. 6,383,955, which is a continuation-in-part of application No. 09/243,156, filed on Feb. 2, 1999, now abandoned.

(30) Foreign Application Priority Data

Feb. 5, 1998 (JP) ............................... 1998-37929

(51) Int. Cl.
*H01L 21/31* (2006.01)

(52) U.S. Cl. .................. 438/787; 438/788; 438/789; 438/790; 427/489; 427/495; 427/515; 257/E21.277; 257/E21.278

(58) Field of Classification Search ......... 438/787–790; 427/489, 495, 515, 535, 539
See application file for complete search history.

(56) References Cited

U.S. PATENT DOCUMENTS 6,352,945 B1 3/2002 Matsuki et al.

(Continued)

FOREIGN PATENT DOCUMENTS

EP          1 225 194 A2    7/2002
JP          2000-349084 A   12/2000

OTHER PUBLICATIONS

A. J. Kalkman, et al., $SiOF_x$ and $SiO_2$ deposition in an ECR-HDP reactor: Tool characterization and film analysis, Microelectronic Engineering 37/38(1999) 271-276.

(Continued)

*Primary Examiner*—Hsien-ming Lee
(74) *Attorney, Agent, or Firm*—Knobbe Martens Olson & Bear LLP

(57) ABSTRACT

A method for forming an insulation film on a semiconductor substrate by plasma reaction includes: vaporizing a silicon-containing hydrocarbon having a Si—O bond compound to provide a source gas; introducing the source gas and a carrier gas without an oxidizing gas into a reaction space for plasma CVD processing; and forming an insulation film constituted by Si, C, O, and H on a substrate by plasma reaction using a combination of low-frequency RF power and high-frequency RF power in the reaction space. The plasma reaction is activated while controlling the flow of the reaction gas to lengthen a residence time, Rt, of the reaction gas in the reaction space.

18 Claims, 1 Drawing Sheet

U.S. PATENT DOCUMENTS

| | | |
|---|---|---|
| 6,383,955 B1 | 5/2002 | Matsuki et al. |
| 6,410,463 B1 | 6/2002 | Matsuki et al. |
| 6,432,846 B1 | 8/2002 | Matsuki et al. |
| 6,436,822 B1 | 8/2002 | Towle |
| 6,455,445 B2 | 9/2002 | Matsuki |
| 6,514,880 B2 | 2/2003 | Matsuki et al. |
| 6,559,520 B2 | 5/2003 | Matsuki et al. |
| 6,653,719 B2 | 11/2003 | Matsuki |
| 6,740,602 B1 * | 5/2004 | Hendriks et al. ............ 438/780 |
| 6,784,123 B2 * | 8/2004 | Matsuki et al. ............ 438/788 |
| 6,818,570 B2 | 11/2004 | Tsuji et al. |
| 6,852,650 B2 * | 2/2005 | Matsuki et al. ............ 438/789 |
| 6,881,683 B2 * | 4/2005 | Matsuki et al. ............ 438/789 |
| 7,064,088 B2 * | 6/2006 | Hyodo et al. ............ 438/787 |
| 7,098,129 B2 * | 8/2006 | Tsuji et al. ................. 438/634 |
| 7,354,873 B2 | 4/2008 | Fukazawa et al. |
| 2003/0100175 A1 | 5/2003 | Nobutoki et al. |
| 2003/0194880 A1 | 10/2003 | Singh et al. |
| 2004/0038514 A1 * | 2/2004 | Hyodo et al. ............... 438/623 |
| 2004/0137757 A1 | 7/2004 | Li et al. |
| 2006/0258176 A1 | 11/2006 | Fukazawa et al. |

OTHER PUBLICATIONS

The Office Action mailed May 4, 2007 issued in U.S. Appl. No. 11/437,951, filed May 19, 2006.

The Office Action mailed Nov. 14, 2007 issued in U.S. Appl. No. 11/465,751, filed Aug. 18, 2006.

\* cited by examiner

METHOD FOR FORMING INSULATION FILM

This is a continuation-in-part of U.S. patent application Ser. No. 10/412,363 filed Apr. 11, 2003, now U.S. Pat. No. 7,064,088, which is a continuation-in-part of U.S. patent application Ser. No. 10/317,239 filed Dec. 11, 2002, now U.S. Pat. No. 6,881,683, which is a continuation-in-part of U.S. patent application Ser. No. 09/827,616 filed Apr. 6, 2001, now U.S. Pat. No. 6,514,880, which is a continuation-in-part of (i) U.S. patent application Ser. No. 09/243,156 filed Feb. 2, 1999, now abandoned, which claims priority to Japanese patent application No. 37929/1998 filed Feb. 5, 1998, (ii) U.S. application Ser. No. 09/326,847 filed Jun. 7, 1999, now U.S. Pat. No. 6,352,945, (iii) U.S. patent application Ser. No. 09/326,848 filed Jun. 7, 1999, now U.S. Pat. No. 6,383,955, and (iv) U.S. patent application Ser. No. 09/691,376 filed Oct. 18, 2000, now U.S. Pat. No. 6,432,846, all of which are incorporated herein by reference in their entirety. This application claims priority to all of the foregoing under 35 U.S.C. § 119 and 120.

BACKGROUND OF THE INVENTION

1. Field of the Invention

This invention relates generally to a semiconductor technique and more particularly to a silicone polymer film used as a low-k (low dielectric constant) film on a semiconductor substrate, which is formed by using a plasma CVD (chemical vapor deposition) apparatus.

2. Description of the Related Art

Because of the recent rise in requirements for the large-scale integration of semiconductor devices, a multi-layered wiring technique attracts a great deal of attention. In these multi-layered structures, however, capacitance among individual wires hinders high speed operations. In order to reduce the capacitance it is necessary to reduce relative dielectric constant of the insulation film. Thus, various materials having a relatively low relative dielectric constant have been developed for insulation films.

Conventional silicon oxide films $SiO_x$ are produced by a method in which oxygen $O_2$ or nitrogen oxide $N_2O$ is added as an oxidizing agent to a silicon source gas such as $SiH_4$ or $Si(OC_2H_5)_4$ and then processed by heat or plasma energy. Its relative dielectric constant is about 4.0.

Alternatively, a fluorinated amorphous carbon film has been produced from $C_xF_yH_z$ as a source gas by a plasma CVD method. Its relative dielectric constant $\epsilon$ is as low as 2.0-2.4.

Another method to reduce the relative dielectric constant of insulation film has been made by using the good stability of Si—O bond. A silicon-containing organic film is produced from a source gas under low pressure (1 Torr) by the plasma CVD method. The source gas is made from P-TMOS (phenyl trimethoxysilane, see below), which is a compound of benzene and silicon, vaporized by a babbling method. The relative dielectric constant $\epsilon$ of this film is as low as 3.1.

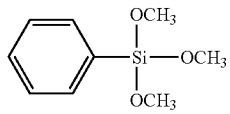

A further method uses a porous structure made in the film. An insulation film is produced from an inorganic SOG material by a spin-coat method. The relative dielectric constant $\epsilon$ of the film is as low as 2.3.

However, the above noted approaches have various disadvantages as described below.

First, the fluorinated amorphous carbon film has lower thermal stability (370° C.), poor adhesion with silicon-containing materials and also lower mechanical strength. The lower thermal stability leads to damage under high temperatures such as over 400° C. Poor adhesion may cause the film to peel off easily. Further, the lower mechanical strength can jeopardize wiring materials.

Oligomers that are polymerized using P-TMOS molecules do not form a linear structure in the vapor phase, such as a siloxane structure, because the P-TMOS molecule has three O—$CH_3$ bonds. The oligomers having no linear structure cannot form a porous structure on a Si substrate, i.e., the density of the deposited film cannot be reduced. As a result, the relative dielectric constant of the film cannot be reduced to a desired degree.

In this regard, the babbling method means a method wherein vapor of a liquid material, which is obtained by having a carrier gas such as argon gas pass through the material, is introduced into a reaction chamber with the carrier gas. This method generally requires a large amount of a carrier gas in order to cause the source gas to flow. As a result, the source gas cannot stay in the reaction chamber for a sufficient length of time to cause polymerization in a vapor phase.

Further, the SOG insulation film of the spin-coat method has a problem in that the material cannot be applied onto the silicon substrate evenly and another problem in which a cure system after the coating process is costly.

In view of the above, various techniques of forming low-k silica insulation films have been developed.

In order to reduce wiring resistance, copper wiring is widely used in combination with low-k silica insulation films. However, copper tends to migrate or diffuse into the silica insulation films. Diffusion of Cu is significantly promoted by heat. In order to prevent this problem, a barrier film for blocking diffusion of Cu is formed between the silica insulation film and copper wiring. Conventionally, SiC is mainly used as a barrier film. However, the dielectric constant of such a barrier film is relatively high, and thus when forming the barrier film, the barrier film increases the effective dielectric constant of the integrated layers including the barrier film. Thus, ideally, the thickness of the barrier film is reduced as much as is practically possible while maintaining Cu-diffusion blocking ability.

In order to determine whether a barrier film is effectively usable, a heat resistance test where a sample is placed an atmosphere at 400° C. for 14 hours is conducted in view of device manufacturing processes. Further, because diffusion of Cu is also promoted when electricity is applied, an electric resistance test is also conducted. As a simple test in place of the above tests, the quality of a barrier film can be evaluated by placing a sample in an atmosphere at 400° C. for four hours and measuring a thickness where Cu penetrates and diffuses in the barrier film. In this test, if the thickness of a Cu-diffused portion of the barrier film is 20 nm or less, the barrier film is considered to be good.

In addition, in order to inhibit oxidation of Cu wiring due to absorption of moisture by a barrier film, impurities such as N or O are introduced into SiC constituting the barrier film. However, SiCN or SiCO tends to have a high dielectric constant such as 4.5-5.0. If SiC containing no impurities is used, the dielectric constant can be reduced, but the barrier film of SiC entails the moisture absorption problem.

Thus, conventionally, no silicon carbide film (herein "silicon carbide" includes pure SiC and non-pure SiC such as SiCOH) having a low dielectric constant such as 4.0 or less and having effective Cu-diffusion blocking ability has been obtained.

Therefore, a principal object of this invention is to provide a method for forming an improved insulation film which can serve as a barrier film and which has a low dielectric constant and/or excellent Cu-diffusion blocking ability.

In view of the fact that properties such as fine structures, barrier effect against copper, and controlling elastic modulus are required for barrier films, another object of this invention is to provide a method for forming an insulation film suitable to be used as a barrier film that has a low dielectric constant, fine structures, and appropriate levels of elastic modulus.

A further object of this invention is to provide a method for forming an insulation film that is a silicon carbide doped with oxygen having a high density and a low dielectric constant.

A still further object of this invention is to provide a method for effectively forming an insulation film without requiring complicated processes.

SUMMARY OF THE INVENTION

One aspect of this invention may involve a method for forming an insulation film on a semiconductor substrate by using a plasma CVD apparatus including a reaction chamber, which method comprises a step of directly vaporizing a silicon-containing hydrocarbon compound expressed by the general formula $Si_\alpha O_\beta C_x H_y$ ($\alpha$, $\beta$, x, and y are integers) and then introducing it to the reaction chamber of the plasma CVD apparatus, a step of introducing an additive gas, the flow volume of which is substantially reduced, into the reaction chamber and also a step of forming an insulation film on a semiconductor substrate by plasma reaction wherein mixed gases made from the vaporized silicon-containing hydrocarbon compound as a source gas and the additive gas are used as a reaction gas. It is a remarkable feature that the reduction of the additive gas flow also results in a substantial reduction of the total flow of the reaction gas. According to the present invention, a silicone polymer film having a micropore porous structure with low dielectric constant can be produced.

The present invention is drawn to a barrier film that may be formed as the above insulation film on a semiconductor substrate, that may be in contact with copper wiring, and that may have characteristics described above.

In embodiments of the present invention, by using an organo silicon having a Si—O bond as a source gas (without an oxidizing gas) which flows at a decreased flow rate to lengthen the residence time (defined below), plasma reaction is carried out in a gaseous phase in a reaction chamber to form an insulation film having fine structures, and by additionally applying low-frequency RF power, the film density (e.g., more than $1.30$ $g/cm^3$, preferably $1.35$ $g/cm^3$ or greater, more preferably $1.4$ to $2.0$ $g/cm^3$ including $1.5$, $1.6$, $1.7$, $1.8$, $1.9$, and values between any two numbers of the foregoing) can be controlled without increasing a dielectric constant (e.g., less than $3.5$, preferably $3.3$ or lower, more preferably $2.8$ to $3.2$ including $2.9$, $3.0$, $3.1$, and values between any two numbers of the foregoing). Although the following explanation does not intend to limit the present invention, by using the precursor having at least one Si—O bond in a molecule for forming a silicon carbide film (e.g., SiCOH), it becomes possible to stabilize Si with an O-terminal and/or a C-terminal. If a precursor having no Si—O bond, such as 3MS or 4MS, is used with an oxygen-supplying gas, the molecules are dissociated in a plasma and Si tends to have an H-terminal and/or OH-terminal which is unstable.

Also, by reducing the distance between the electrodes, using low-frequency RF power mixed with high-frequency RF power, and/or using a reaction gas containing no oxygen-supplying gas and/or crosslinking gas, a silicon carbide film (Si—C based structure), not a low-k film (Si—O based structure), can be formed, and the film density can increase.

Conventional SiC has a relatively low dielectric constant but does not sufficiently block moisture penetration, whereas conventional SiCN or SiCO has a relatively high dielectric constant but can effectively block moisture penetration. This may be because the conventional SiC has a low density of $1.1$-$1.3$ $g/cm^3$ as compared with the conventional SiCN or SiCO having a density of $1.8$-$2.0$ $g/cm^3$. In an embodiment, the insulation film has as low a dielectric constant as that of SiC or lower than that of SiC, but the insulation film has as high Cu-diffusion blocking ability and as high dry etching selectivity against a low-k film as SiCN or SiCO (having a dielectric constant of $4.0$ to $4.5$) which are formed using 3MS or 4MS as a precursor gas. The insulation film according to an embodiment of the present invention has a high density and thus exhibits high etching-selectivity as compared with a low-k film (an etching selectivity against a low-k film may be in the range of 5-10) and also exhibits low Cu-penetration thickness (which may be 5-15 nm as measured under the Cu-diffusion blocking test). Thus, in an embodiment, the insulation film can effectively be used as a barrier film and can also be used as a hard film or an etch-stopper film.

Further, by adding an additive gas, elastic modulus of the insulation film can be improved. When the insulation film serves as a barrier film, preferably, the barrier film has compressive stress in view of wiring stress and adhesion to a Cu layer.

For purposes of summarizing the invention and the advantages achieved over the prior art, certain objects and advantages of the invention have been described above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description of the preferred embodiments which follow.

BRIEF DESCRIPTION OF THE DRAWINGS

These and other features of this invention will now be described with reference to the drawings of preferred embodiments which are intended to illustrate and not to limit the invention.

DETAILED DESCRIPTION OF THE PREFERRED EMBODIMENT

Figure 1:
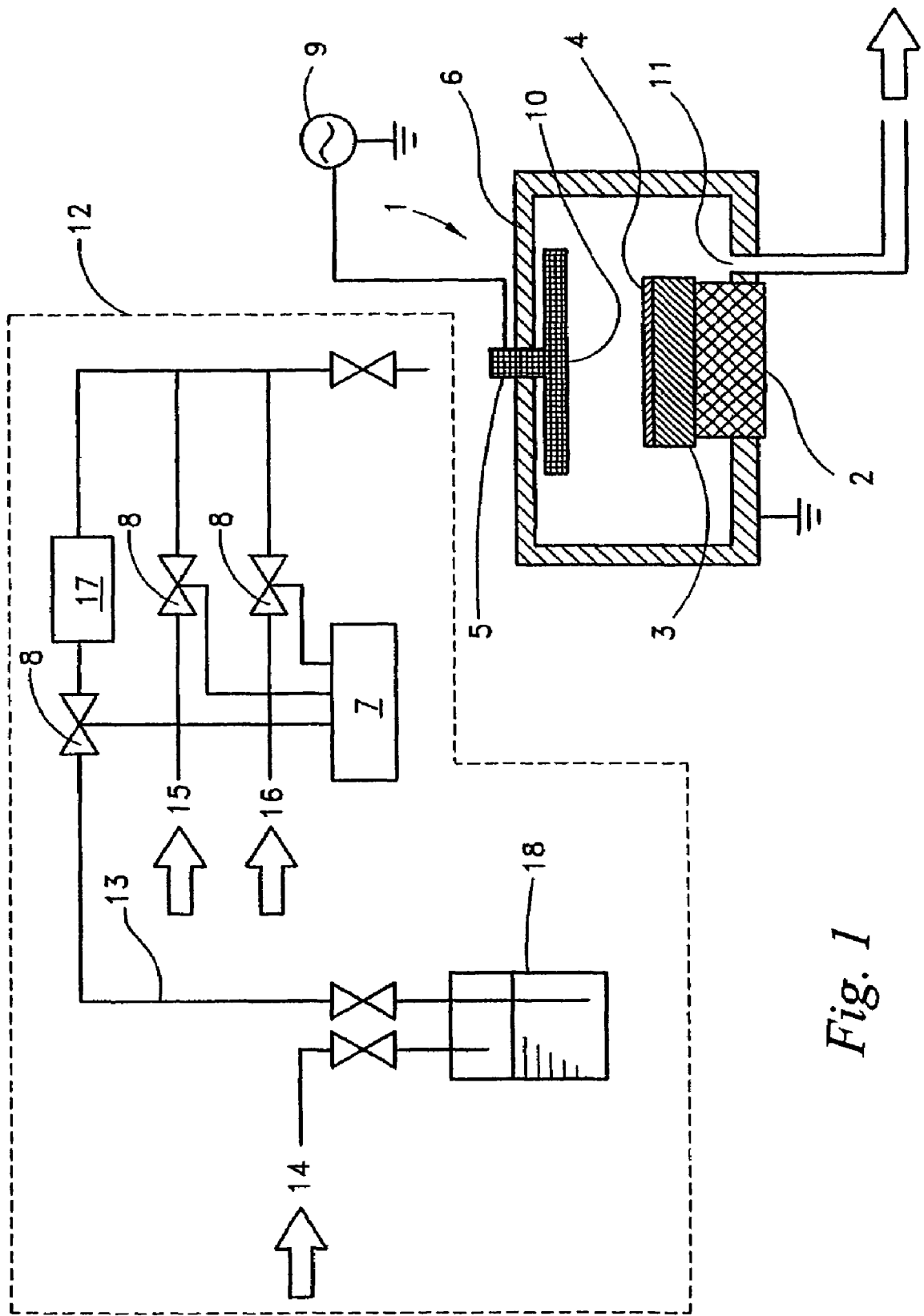
FIG. 1 is a schematic diagram illustrating a plasma CVD apparatus usable forming an insulation film according to the present invention.

In an embodiment of the present invention, an insulation film may be formed on a low-k film or on a Cu layer or formed on a surface of a via and/or trench in a damascene process as a barrier film. The insulation film may be formed using the same source gas as those used for forming a low-k film formed by the method described below in an embodiment. In that case, the insulation film and the low-k film can continuously be formed using the same equipment, thereby eliminating particle contamination problems and increasing productivity.

In an embodiment, the present invention provides a method for forming an insulation film on a semiconductor substrate by plasma reaction, comprising the steps of: (i) vaporizing a silicon-containing hydrocarbon compound to provide a source gas, said silicon-containing hydrocarbon compound comprising a Si—O bond in a molecule; (ii) introducing a reaction gas comprising the source gas and a carrier gas without an oxygen-supplying gas into a reaction space for plasma CVD processing wherein a semiconductor substrate is placed; and (iii) forming an insulation film constituted by Si, C, O, and H on the substrate by plasma reaction using a combination of low-frequency RF power and high-frequency RF power in the reaction space, wherein the plasma reaction is activated while controlling the flow of the reaction gas to lengthen a residence time, Rt, of the reaction gas in the reaction space, wherein 100 msec≦Rt, $$Rt[s]=9.42\times10^{7}(Pr\cdot Ts/Ps\cdot Tr)r_w^2 d/F$$

wherein:
Pr: reaction space pressure (Pa)
Ps: standard atmospheric pressure (Pa)
Tr: average temperature of the reaction (K)
Ts: standard temperature (K)
$r_w$: radius of the silicon substrate (m)
d: space between the silicon substrate and the upper electrode (m)
F: total flow volume of the reaction gas (sccm).

The above embodiment further includes the following embodiments:

The residence time (Rt) may be in the range of 100 msec to 150 msec (including 110 msec, 120 msec, 130 msec, 140 msec, and values between any two numbers of the foregoing).

The reactive group may be selected from the group consisting of alkoxy group, vinyl group, amino group, and acid radical. The silicon-containing hydrocarbon compound may have the formula $Si_\alpha O_{\alpha-1} R_{2\alpha-\beta+2}(OR')_\beta$ wherein α is an integer of 1-3, β is 0, 1, or 2, n is an integer of 1-3, R is $C_{1-6}$ hydrocarbon attached to Si, and R' is $C_{1-6}$ hydrocarbon unattached to Si. R' may be $C_n H_{2n+1}$ wherein n is an integer of 1-3. The silicon-containing hydrocarbon compound comprising a Si—O bond in a molecule includes, but is not limited to, the following:

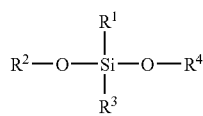

(In the formula, $R^1$, $R^2$, $R^3$ and $R^4$ are independently any of $CH_3$, $C_2H_5$, $C_3H_7$, $C_6H_5$, $C_2H_3$, $C_3H_5$, $C_4H_7$, and $C_4H_5$, and at least one of $R^1$ and $R^3$ may include CH=CH)

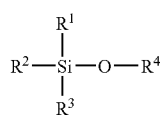

(In the formula, $R^1$, $R^2$, $R^3$ and $R^4$ are independently any of $CH_3$, $C_2H_5$, $C_3H_7$, $C_6H_5$, $C_2H_3$, $C_3H_5$, $C_4H_7$, and $C_4H_5$, and at least one of $R^1$, $R^2$, and $R^3$ may include CH=CH)

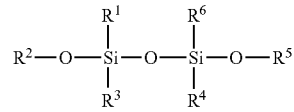

(In the formula, $R^1$, $R^2$, $R^3$, $R^4$, $R^5$, and $R^6$ are independently any of $CH_3$, $C_2H_5$, $C_3H_7$, $C_6H_5$, $C_2H_3$, $C_3H_5$, $C_4H_7$, and $C_4H_5$, and at least one of $R^1$, $R^3$, $R^4$, and $R^6$ may include CH=CH)

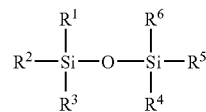

(In the formula, $R^1$, $R^2$, $R^3$, $R^4$, $R^5$, and $R^6$ are independently any of $CH_3$, $C_2H_5$, $C_3H_7$, $C_6H_5$, $C_2H_3$, $C_3H_5$, $C_4H_7$, and $C_4H_5$, and at least one of $R^1$, $R^3$, $R^4$, and $R^6$ may include CH=CH)

One or more of the silicon-containing hydrocarbon compounds represented by any of the formulae can be used. For example, dimethyldimethoxysilane (DMDMOS, $SiO_2C_4H_{12}$), diethyldiethoxysilane (DEDEOS, $SiO_2C_8H_{20}$), phenyltrimethoxysilane (PTMOS, $SiO_4C_9H_{14}$), 1,3-dimethoxytetramethyl disilane (DMOTMDS, $Si_2O_3C_6H_{18}$), and hexamethydisilane (HMDS, $Si_2OC_6H_{18}$) are included. In an embodiment, cyclic silicon-containing hydrocarbon compounds having a Si—O bond can be used. Preferably, however, linear silicon-containing hydrocarbon compounds having a Si—O bond, more preferably, O—Si—O bond, may be used in an embodiment.

The carrier gas may be selected from the group consisting of He, Ar, Kr, and Xe. The carrier gas may be introduced at a flow rate of 10 sccm to 100 sccm (including 20 sccm, 40 sccm, 60 sccm, 80 sccm, and values between any two numbers of the foregoing).

The method may further comprise introducing an additive gas selected from the group consisting of an oxidizing gas and a gas of $CO_2$, $H_2$, CxHyOz wherein x=1-5, y=2x or 2x+2, and z=0 or 1 (e.g., $C_2H_4$, $C_2H_6$, $C_3H_6$, $C_3H_8$, $C_2H_5(OH)$, and $C_3H_7(OH)$), into the reaction space when the source gas is introduced in order to further eliminate unstable bonds or terminals of Si. These gases do not typically serve as an oxygen-supplying gas which supplies oxygen to be bound to Si (i.e., even if a molecule of the gas contains oxygen, the oxygen is insignificantly involved in formation of a basal structure of the resulting film) or crosslinking gas (i.e., a molecule of the gas is insignificantly involved in formation of a basal structure of the resulting film). The additive gas may be introduced at a flow rate of 10 sccm to 100 sccm (including 20 sccm, 40 sccm, 60 sccm, 80 sccm, and values between any two numbers of the foregoing).

The flow rate of the source gas can be adjusted according to the residence time (Rt), and in an embodiment, it may be 25-400 sccm (including 50 sccm, 100 sccm, 150 sccm, 200 sccm, 300 sccm, and values between any two numbers of the foregoing). The flow rate of the source gas may be at lest 30% of the total gas flow (including 40%, 50%, 60%, 70%, 80%, and values between any two numbers of the foregoing).

The low-frequency RF power may be 1%-50% of the high-frequency RF power (including 5%, 10%, 15%, 20%, 30%, 40%, and values between any two numbers of the foregoing). The low-frequency RF power may have a frequency of 2 MHz or less (e.g., 400 kHz, 430 kHz). The high-frequency RF power may have a frequency selected from the group consisting of 13.56 MHz, 27 MHz, and 60 MHz (in an embodiment, 20 MHz or higher). In an embodiment, the total RF power may be 400 W or higher (450 W, 500 W, 750 W, 1000 W, and values between any two numbers of the foregoing).

The average temperature of the reaction (Tr) may be in a range of 323K to 823K.

The insulation film may be a silicon carbide film doped with oxygen. The oxygen content may be 5% to 30% (including 10%, 15%, 20%, 25%, and values between any two numbers of the foregoing). The insulation film may be composed further of N. The insulation film may be a barrier film for blocking Cu-diffusion. The barrier film may have a thickness of 25 nm to 70 nm (including 30 nm, 40 nm, 50 nm, 60 nm, and values between any two numbers of the foregoing; in another embodiment, 20 nm to 100 nm).

The space between the silicon substrate and the upper electrode (d) may be less than 0.014 m (including 0.012 m, 0.010 m, 0.008 m, 0.006 m, and values between any two numbers of the foregoing).

The substrate may have a via and/or trench is formed wherein the insulation film is to be formed on a surface of the via and/or trench. The substrate may have an exposed Cu layer on which the insulation film is to be formed. Because no oxygen-supplying gas is used, the insulation film can be deposited directly on a Cu layer.

In another aspect, the present invention provides a method for forming an interconnect structure, comprising the steps of: (i) forming a via and/or trench for interconnect in a substrate; (ii) forming a barrier layer on a surface of the via and/or trench using any method of the foregoing; and (iii) forming a Cu layer on the barrier layer. In the above, the via and/or trench may be formed by a single or dual damascene process.

In still another aspect, the present invention provides an insulation film obtainable by any method of the foregoing, constituted by Si, C, O, and H and having a density of more than 1.3 g/cm³ and a dielectric constant of 3.3 or less. In the above, the insulation film may be a silicon carbide doped with oxygen.

In all of the aforesaid embodiments and aspects, any element used in an embodiment or aspect can interchangeably or additionally be used in another embodiment or aspect unless such a replacement is not feasible or causes adverse effect.

Compounds which can be mixed include a compound having at least one Si—O bond, two or less O—$C_nH_{2n+1}$ bonds and at least two hydrocarbon radicals bonded with silicon (Si). A preferable silicon-containing hydrocarbon compound has formula:

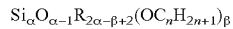

wherein α is an integer of 1-3, β is 0, 1, or 2, n is an integer of 1-3, and R is $C_{1-6}$ hydrocarbon attached to Si.

More specifically, the silicon-containing hydrocarbon compound includes at least one species of the compound expressed by the following chemical formula:

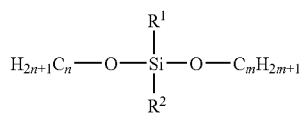

wherein R1 and R2 are one of $CH_3$, $C_2H_3$, $C_2H_5$, $C_3H_7$ and $C_6H_5$, and m and n are any integer.

Except for the species indicated above, the silicon-containing hydrocarbon compound can include at least one species of the compound expressed by the following chemical formula:

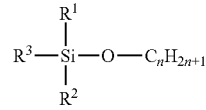

wherein R1, R2 and R3 are one of $CH_3$, $C_2H_3$, $C_2H_5$, $C_3H_7$ and $C_6H_5$, and n is any integer.

Except for those species indicated above, the silicon-containing hydrocarbon compound can include at least one species of the compound expressed by the following chemical formula:

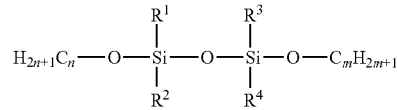

wherein R1, R2, R3 and R4 are one of $CH_3$, $C_2H_3$, $C_2H_5$, $C_3H_7$ and $C_6H_5$, and m and n are any integer.

Further, except for those species indicated above, the silicon-containing hydrocarbon compound can include at least one species of the compound expressed by the following chemical formula:

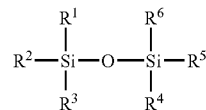

wherein R1, R2, R3, R4, R5 and R6 are one of $CH_3$, $C_2H_3$, $C_2H_5$, $C_3H_7$ and $C_6H_5$, and the additive gases are argon (Ar), Helium (He) and either nitrogen oxide ($N_2O$) or oxygen ($O_2$).

The residence time of the reaction gas is determined based on the capacity of the reaction chamber for reaction, the pressure adapted for reaction, and the total flow of the reaction gas. The reaction pressure is normally in the range of 1-10 Torr, preferably 3-7 Torr, so as to maintain stable plasma. This reaction pressure is relatively high in order to lengthen the residence time of the reaction gas. The total flow of the reaction gas is important to reducing the relative dielectric constant of a resulting film. It is not necessary to control the ratio of the source gas to the additive gas. In general, the longer the residence time, the lower the relative dielectric constant becomes. The source gas flow necessary for forming a film depends on the desired deposition rate and the area of a substrate on which a film is formed. For example, in order to form a film on a substrate [r(radius)=100 mm] at a deposition rate of 300 nm/min, at least 50 sccm of the source gas is expected to be included in the reaction gas. That is approximately $1.6 \times 10^2$ sccm per the surface area of the substrate (m²). The total flow can be defined by residence time (Rt). When Rt is defined described below, a preferred range of Rt is 100 msec≦Rt, more preferably 200 msec≦Rt≦5 sec. In a conventional plasma TEOS, Rt is generally in the range of 10-30 msec.

$$Rt[s]=9.42\times10^7(Pr \cdot Ts/Ps \cdot Tr)r_w^2 d/F$$

wherein:
- Pr: reaction chamber pressure (Pa)
- Ps: standard atmospheric pressure (Pa)
- Tr: average temperature of the reaction (K)
- Ts: standard temperature (K)
- $r_w$: radius of the silicon substrate (m)
- d: space between the silicon substrate and the upper electrode (m)
- F: total flow volume of the reaction gas (sccm)

In the above, the residence time means the average period of time in which gas molecules stay in the reaction chamber. The residence time (Rt) can be calculated at $Rt=\alpha V/S$, wherein V is the capacity of the chamber (cc), S is the volume of the reaction gas (cc/s), and $\alpha$ is a coefficient determined by the shape of the reaction chamber and the positional relationship between the inlet of gas and the outlet of exhaust. The space for reaction in the reaction chamber is defined by the surface of the substrate ($\pi r^2$) and the space between the upper electrode and the lower electrode. Considering the gas flow through the space for reaction, $\alpha$ can be estimated as 1/2. In the above formula, $\alpha$ is 1/2.

In this method, the source gas is, in short, a silicon-containing hydrocarbon compound including at least one Si—O bond, at most two O—$C_nH_{2n+1}$ bonds and at least two hydrocarbon radicals bonded to the silicon (Si). Also, this source gas is vaporized by a direct vaporization method. The method results in an insulation film having a low relative dielectric constant, high thermal stability and high humidity-resistance.

Further aspects, features and advantages will become apparent from the detailed description of the preferred examples which follows.

FIG. 1 diagrammatically shows a plasma CVD apparatus usable in this invention. This apparatus comprises a reaction gas-supplying device 12 and a plasma CVD device 1. The reaction gas-supplying device 12 comprises plural lines 13, control valves 8 disposed in the lines 13, and gas inlet ports 14, 15 and 16. A flow controller 7 is connected to the individual control valves 8 for controlling a flow of a source gas of a predetermined volume. A container accommodating liquid reacting material 18 is connected to a vaporizer 17 that directly vaporizes liquid. The plasma CVD device 1 includes a reaction chamber 6, a gas inlet port 5, a susceptor 3 and a heater 2. A circular gas diffusing plate 10 is disposed immediately under the gas inlet port. The gas diffusing plate 10 has a number of fine openings at its bottom face and can inject reaction gas to the semiconductor substrate 4 therefrom. There is an exhaust port 11 at the bottom of the reaction chamber 6. This exhaust port 11 is connected to an outer vacuum pump (not shown) so that the inside of the reaction chamber 6 can be evacuated. The susceptor 3 is placed in parallel with and facing the gas diffusing plate 10. The susceptor 3 holds a semiconductor substrate 4 thereon and heats it with the heater 2. The gas inlet port 5 is insulated from the reaction chamber 6 and connected to an outer high frequency power supply 9. Alternatively, the susceptor 3 can be connected to the power supply 9. Thus, the gas diffusing plate 10 and the susceptor 3 act as a high frequency electrode and generate a plasma reacting field in proximity to the surface of the semiconductor substrate 4.

A method for forming an insulation film on a semiconductor substrate by using the plasma CVD apparatus comprises a step of directly vaporizing silicon-containing hydrocarbon compounds expressed by the general formula $Si_\alpha O_\beta C_x H_y$ ($\alpha$, $\beta$, x, and y are integers) and then introducing it to the reaction chamber 6 of the plasma CVD device 1, a step of introducing an additive gas, whose flow is substantially reduced, into the reaction chamber 6 and also a step of forming an insulation film on a semiconductor substrate by plasma reaction wherein mixed gases, made from the silicon-containing hydrocarbon compound as a source gas and the additive gas, are used as a reaction gas. It is a remarkable feature that the reduction of the additive gas flow also renders a substantial reduction of the total flow of the reaction gas. This feature will be described in more detail later.

The additive gases used in this embodiment, more specifically, are argon gas and helium gas. Argon is principally used for stabilizing plasma, while helium is used for improving uniformity of the plasma and also uniformity of thickness of the insulation film.

In the method described above, the first step of direct vaporization is a method wherein a liquid material, the flow of which is controlled, is instantaneously vaporized at a vaporizer that is preheated. This direct vaporization method requires no carrier gas such as argon to obtain a designated amount of the source gas. This differs greatly with the babbling method. Accordingly, a large amount of argon gas or helium gas is no longer necessary and this reduces the total gas flow of the reaction gas and then lengthens the time in which the source gas stays in the plasma. As a result, sufficient plasma reactions occur in the vapor so that a linear polymer can be formed and a film having a micropore porous structure can be obtained.

In FIG. 1, inert gas supplied through the gas inlet port 14 pushes out the liquid reacting material 18, which is the silicon-containing hydrocarbon compound, to the control valve 8 through the line 13. The control valve 8 controls the flow of the liquid reacting material 18 with the flow controller 7 so that it does not exceed a predetermined volume. The reduced silicon-containing hydrocarbon compound 18 goes to the vaporizer 17 to be vaporized by the direct vaporization method described above. Argon and helium are supplied through the inlet ports 15 and 16, respectively, and the valve 8 controls the flow volume of these gases. The mixture of the source gas and the additive gases, which is a reaction gas, is then supplied to the inlet port 5 of the plasma CVD device 1. The space between the gas diffusing plate 10 and the semiconductor substrate 4, both located inside of the reaction chamber 6 which is already evacuated, is charged with high frequency RF voltages, which are preferably 13.4 MHz and 430 kHz, and the space serves as a plasma field. The susceptor 3 continuously heats the semiconductor substrate 4 with the heater 2 and maintains the substrate 4 at a predetermined temperature that is desirably 350-450° C. The reaction gas supplied through the fine openings of the gas diffusing plate 10 remains in the plasma field in proximity to the surface of the semiconductor substrate 4 for a predetermined time.

If the residence time is short, a linear polymer cannot be deposited sufficiently so that the film deposited on the substrate does not form a micropore porous structure. Since the residence time is inversely proportional to the flow volume of the reaction gas, a reduction of the flow volume of the reaction gas, can lengthen its residence time.

Extremely reducing the total volume of the reaction gas is effected by reducing the flow volume of the additive gas. As a result, the residence time of the reaction gas can be lengthened so that a linear polymer is deposited sufficiently and subsequently an insulation film having a micropore porous structure can be formed.

In order to adjust the reaction in the vapor phase, it is effective to add a small amount of an inert gas, an oxidizing agent, or a reducing agent to the reaction chamber. Helium (He) and Argon (Ar) are inert gases and have different first ionization energies of 24.56 eV and 15.76 eV, respectively. Thus, by adding either He or Ar singly or both in combination in predetermined amounts, the reaction of the source gas in the vapor phase can be controlled. Molecules of the reaction gas undergo polymerization in the vapor phase, thereby forming oligomers. The oligomers are expected to have a O:Si ratio of 1:1. However, when the oligomers form a film on the substrate, the oligomers undergo further polymerization, resulting in a higher oxygen ratio. The ratio varies depending on the relative dielectric constant or other characteristics of a film formed on the substrate.

EXAMPLE

Experiments were conducted as described below. The results are indicated in tables below. In these experiments, an ordinary plasma CVD device (EAGLE®-10, ASM Japan K.K.) was used as an experimental device wherein:
rw (radius of the silicon substrate): 0.1 m
d (space between the silicon substrate and the upper electrode): 0.024 m
Ps (standard atmospheric pressure): $1.01 \times 10^5$ Pa
Ts (standard temperature): 273 K The thickness of each insulation film was set at 50 nm, except that the thickness of each insulation film for measuring a dielectric constant was set at 200 nm.

Etching selectivity of each insulation film was evaluated against a low-k film having a dielectric constant of 2.5 which was formed as follows in accordance with Example 6 disclosed in U.S. patent application Ser. No. 11/086,598, filed Mar. 22, 2005 commonly owned by the same assignee as in the present application, the disclosure of which is herein incorporated by reference in its entirety.
DMOTMDS: 250 sccm; He: 200 sccm; Isopropyl alcohol: 400 sccm; O2: 150 sccm.
Temperature: 400° C.; Pressure: 800 Pa.
Dielectric constant: 2.5; Modulus: 5.5 GPa.

Etching selectivity of each insulation film was evaluated against a low-k film having a dielectric constant of 2.3 which was formed as follows in accordance with Example 5 disclosed in U.S. patent application Ser. No. 11/175,511, filed Jul. 6, 2005 commonly owned by the same assignee as in the present application, the disclosure of which is herein incorporated by reference in its entirety.
(Film Formation Process)
DMOTMDS flow rate: 150 sccm; He flow rate: 150 sccm; Isopropyl alcohol flow rate: 300 sccm.
Reactor pressure: 800 Pa.
(UV Curing Process)
Wavelength: 172 nm, 3-10 mW/cm$^2$, Susceptor temperature: 200° C., N2: 5 SLM, Pressure: 45 Torr, Time: 70 sec.
Dielectric constant: 2.3; Modulus: 7.5 GPa.

In the above, etching selectivity can be evaluated by two ways. The first method is etching a silicon carbide film under conditions set for a low-k film and evaluating a ratio of an etching rate of the low-k film to that of the silicon carbide film. The second method is etching a silicon carbide film formed on a low-k film in a stack structure and more directly evaluating a ratio of an etching rate of the low-k film to that of the silicon carbide film than in the first method. Because in the second method, the etching conditions are similar to those actually used, which include influence by by-products of etching, for example, the evaluated ratio is more reliable than in the first method. In the examples, the second method was used wherein $C_4F_8$ or $CF_4$ as an etching gas was mixed and introduced into a reactor, and etching was conducted under conditions such that a ratio of an etching rate of Aurora®ULK (a siloxane polymer-based low-k film, ASM Japan K.K.) to an etching rate of SiCO or SiCN is 10-12. A ratio of the etching rate of the low-k film to that of the insulation film was defined as etching selectivity.

Further, each insulation film was subjected to a Cu-diffusion blocking test which was conducted by placing a sample in an atmosphere at 400° C. for four hours and measuring a thickness where Cu penetrates and diffuses in each film. In this test, if the thickness of a Cu diffused portion of the film is 20 nm or less, the film is considered to be good as a barrier film.

Example 1

The conditions for forming a hard film are as follows:
DMOTMDS (1,3-dimethoxytetramethyl disiloxane): 100 sccm
He: 100 sccm
Pr (reaction chamber pressure): 566 Pa
RF power supply (HF: 27.12 MHz): 400 W
RF power supply (LF: 400kHz): 100 W
Tr (average temperature of the reaction): 648 K
F (total flow volume of the reaction gas): 200 sccm
Rt (residence time; Rt[s]=$9.42 \times 10^7 (Pr \cdot Ts/Ps \cdot Tr) r_w^2 d/F$): 111 ms The characteristics of the insulation film obtained are as follows, and as can be seen, all of the dielectric constant, leakage current, voltage resistance, Modulus, density, etching selectivity, and Cu-diffusion blocking ability of the insulation film are satisfactory:
k (dielectric constant): 2.95
Leakage current (2 MV/cm): 2.7E−10
Voltage resistance: 6 MV/cm
Modulus: 30 GPa
Density: 1.5 g/cm$^3$
Etching selectivity against the low-k film (k=2.5): 6
Etching selectivity against the low-k film (k=2.3): 7.5
Cu-diffusion blocking ability: 10 nm As indicated above, even though the insulation film had a low dielectric constant, the insulation film had excellent Cu-diffusion blocking ability and high etching selectivity against low-k films. In other words, even though the insulation film had a high density and high modulus, the insulation film had a low dielectric constant.

Example 2

The conditions for forming a hard film are as follows:
HMDS (hexamethydisilane ): 100 sccm
He: 110 sccm
Pr (reaction chamber pressure): 630 Pa
RF power supply (HF: 27.12 MHz): 400 W
RF power supply (LF: 400 kHz): 50 W
Tr (average temperature of the reaction): 648 K
F (total flow volume of the reaction gas): 450 sccm
Rt (residence time; Rt[s]=$9.42 \times 10^7 (Pr \cdot Ts/Ps \cdot Tr) r_w^2 d/F$): 118 ms The characteristics of the insulation film obtained are as follows, and as can be seen, all of the dielectric constant, leakage current, voltage resistance, Modulus, density, etching selectivity, and Cu-diffusion blocking ability of the hard film are satisfactory:
k (dielectric constant): 3.2
Leakage current (2 MV/cm): 1.5E−10
Voltage resistance: 6 MV/cm
Modulus: 45 GPa
Density: 1.65 g/cm$^3$
Etching selectivity against the low-k film (k=2.5): 7

Etching selectivity against the low-k film (k=2.3): 9
Cu-diffusion blocking ability: 10 nm As indicated above, even though the insulation film had a low dielectric constant, the insulation film had excellent Cu-diffusion blocking ability and high etching selectivity against low-k films. In other words, even though the insulation film had a high density and high modulus, the insulation film had a low dielectric constant.

Example 3

The conditions for forming a hard film are as follows:
DM-DMOS (dimethyldimethoxysilane): 130 sccm
He: 100 sccm
Pr (reaction chamber pressure): 700 Pa
RF power supply (HF: 27.12 MHz): 400 W
RF power supply (LF: 400 kHz): 100 W
Tr (average temperature of the reaction): 648 K
F (total flow volume of the reaction gas): 230 sccm
Rt (residence time; $Rt[s]=9.42\times10^7(Pr \cdot Ts/Ps \cdot Tr)r_w^2 d/F$): 120 ms The characteristics of the insulation film obtained are as follows, and as can be seen, all of the dielectric constant, leakage current, voltage resistance, Modulus, density, etching selectivity, and Cu-diffusion blocking ability of the hard film are satisfactory:
k (dielectric constant): 3.01
Leakage current (2 MV/cm): 2.00E−10
Voltage resistance: 6 MV/cm
Modulus: 35 GPa
Density: 1.6 g/cm$^3$
Etching selectivity against the low-k film (k=2.5): 7
Etching selectivity against the low-k film (k=2.3): 8
Cu-diffusion blocking ability: 12 nm As indicated above, even though the insulation film had a low dielectric constant, the insulation film had excellent Cu-diffusion blocking ability and high etching selectivity against low-k films. In other words, even though the insulation film had a high density and high modulus, the insulation film had a low dielectric constant.

Example 4

The conditions for forming a hard film are as follows:
DM-DMOS (dimethyldimethoxysilane): 150 sccm
He: 80 sccm
Pr (reaction chamber pressure): 725 Pa
RF power supply (HF: 27.12 MHz): 400 W
RF power supply (LF: 400 kHz): 100 W
Tr (average temperature of the reaction): 648 K
F (total flow volume of the reaction gas): 230 sccm
Rt (residence time; $Rt[s]=9.42\times10^7(Pr \cdot Ts/Ps \cdot Tr)r_w^2 d/F$): 125 ms The characteristics of the insulation film obtained are as follows, and as can be seen, all of the dielectric constant, leakage current, voltage resistance, Modulus, density, etching selectivity, and Cu-diffusion blocking ability of the hard film are satisfactory:
k (dielectric constant): 2.95
Leakage current (2 MV/cm): 4.40E−10
Voltage resistance: 7 MV/cm
Modulus: 47 GPa
Density: 1.58 g/cm$^3$
Etching selectivity against the low-k film (k=2.5): 5.5
Etching selectivity against the low-k film (k=2.3): 7
Cu-diffusion blocking ability: 13.5 nm As indicated above, even though the insulation film had a low dielectric constant, the insulation film had excellent Cu-diffusion blocking ability and high etching selectivity against low-k films. In other words, even though the insulation film had a high density and high modulus, the insulation film had a low dielectric constant.

Example 5

The conditions for forming a hard film are as follows:
DM-DMOS (dimethyldimethoxysilane): 100 sccm
He: 90 sccm
Pr (reaction chamber pressure): 720 Pa
RF power supply (HF: 13.56 MHz): 400 W
RF power supply (LF: 400 kHz): 100 W
Tr (average temperature of the reaction): 648 K
F (total flow volume of the reaction gas): 500 sccm
Rt (residence time; $Rt[s]=9.42\times10^7(Pr \cdot Ts/Ps \cdot Tr)r_w^2 d/F$): 149 ms The characteristics of the insulation film obtained are as follows, and as can be seen, all of the dielectric constant, leakage current, voltage resistance, Modulus, density, etching selectivity, and Cu-diffusion blocking ability of the hard film are satisfactory:
k (dielectric constant): 3.05
Leakage current (2 MV/cm): 2.90E−10
Voltage resistance: 7.2 MV/cm
Modulus: 39 GPa
Density: 1.55 g/cm$^3$
Etching selectivity against the low-k film (k=2.5): 6
Etching selectivity against the low-k film (k=2.3): 8
Cu-diffusion blocking ability: 13 nm As indicated above, even though the insulation film had a low dielectric constant, the insulation film had excellent Cu-diffusion blocking ability and high etching selectivity against low-k films. In other words, even though the insulation film had a high density and high modulus, the insulation film had a low dielectric constant.

Example 6

The conditions for forming a hard film are as follows:
DM-DMOS (dimethyldimethoxysilane): 250 sccm
He: 150 sccm
Pr (reaction chamber pressure): 720 Pa
RF power supply (HF: 13.56 MHz): 400 W
RF power supply (LF: 400 kHz): 100 W
Tr (average temperature of the reaction): 648 K
F (total flow volume of the reaction gas): 400 sccm
Rt (residence time; $Rt[s]=9.42\times10^7(Pr \cdot Ts/Ps \cdot Tr)r_w^2 d/F$): 106 ms The characteristics of the insulation film obtained are as follows, and as can be seen, all of the dielectric constant, leakage current, voltage resistance, Modulus, and density of the hard film are satisfactory:
k (dielectric constant): 3.05
Leakage current (2 MV/cm): 2.90E−10
Voltage resistance: 6.4 MV/cm
Modulus: 41 GPa
Density: 1.56 g/cm$^3$ As indicated above, even though the insulation film had a high density and high modulus, the insulation film had a low dielectric constant.

Example 7

The conditions for forming a hard film are as follows:
DM-DMOS (dimethyldimethoxysilane): 120 sccm
He: 80 sccm
Pr (reaction chamber pressure): 720 Pa
RF power supply (HF: 27.12 MHz): 400 W
RF power supply (LF: 400 kHz): 100 W
Tr (average temperature of the reaction): 648 K
F (total flow volume of the reaction gas): 200 sccm
Rt (residence time; $Rt[s]=9.42\times10^7(Pr\cdot Ts/Ps\cdot Tr)r_w^2 d/F$): 113 ms The characteristics of the insulation film obtained are as follows, and as can be seen, all of the dielectric constant, leakage current, voltage resistance, Modulus, and density of the hard film are satisfactory:

k (dielectric constant): 3.1
Leakage current (2 MV/cm): 4.90E−10
Voltage resistance: 6.1 MV/cm
Modulus: 35 GPa
Density: 1.53 g/cm$^3$ As indicated above, even though the insulation film had a high density and high modulus, the insulation film had a low dielectric constant.

The present invention includes the above mentioned embodiments and other various embodiments including the following:

In the above, the reaction space should not be limited to a physically defined single section, but should include any suitable space for plasma reaction. That is, as one of ordinary skill in the art readily understands, the space is a functionally defined reaction space. The space may be comprised of a physically defined single section such as the interior of a reactor, or physically defined multiple sections communicated with each other for plasma reaction, such as the interior of a remote plasma chamber and the interior of a reactor. Further, the space includes the interior of piping connecting multiple sections through which a reaction gas passes. The interior of the reactor includes only the space used for plasma reaction. Thus, if only a part of the reactor interior is used for plasma reaction where the reactor is composed of multiple sections, only the part used for plasma reaction constitutes a reaction space. Further, the plasma reaction includes a preliminary reaction for plasma polymerization. For example, upstream of a reactor, heating a reaction gas (e.g., 150° C. to 500° C., preferably 200° C. to 300° C., in a pre-heater chamber), exciting a reaction gas (e.g., in a remote plasma chamber), or mixing an excited additive gas and a source gas (e.g., in a pre-heater chamber) is included in a preliminary reaction.

The source gas and the additive gas are separately introduced into the reaction space. The additive gas and the source gas can be mixed upstream of a reactor and introduced into the reactor. However, they can be introduced separately, depending on the configuration of a reactor. As long as the gases are not in a reactive state, regardless of whether the additive gas and the source gas are mixed or separated, the space where the gases are present does not constitute a reaction space. At a point where additive gas and the source gas are in contact in a reactive state, the reaction space begins. The reactive state includes states where the reaction gas is heated or excited, or the excited additive gas and the source gas are mixed, for example.

The plasma reaction comprises exciting the reaction gas and depositing the film on the substrate. As described above, the plasma reaction includes a preliminary reaction such as excitation of the reaction gas.

The reaction space comprises a space for exciting the reaction gas and a space for depositing the film. In this embodiment, the reaction gas can be excited in a remote plasma chamber installed upstream of a reactor, and the film is deposited on the substrate in the reactor. The source gas and the additive gas can be introduced into the remote plasma chamber. In this case, the reaction space is composed of the interior of the remote plasma chamber, the interior of the reactor, and the interior of the piping connecting the remote plasma chamber and the reactor. Because of using the interior of the remote plasma chamber, the interior of the reactor can be significantly reduced, and thus, the distance between the upper electrode and the lower electrode can be reduced. This leads to not only downsizing the reactor, but also uniformly controlling a plasma over the substrate surface. Any suitable remote plasma chamber and any suitable operation conditions can be used in the present invention. For example, usable are the apparatus and the conditions disclosed in U.S. patent applications Ser. No. 09/511,934 filed Feb. 24, 2000 and Ser. No. 09/764,523 filed Jan. 18, 2001, U.S. Pat. Nos. 5,788,778, and 5,788,799. The disclosure of each of the above is incorporated herein by reference in its entirety.

The excitation of the reaction gas comprises exciting the additive gas and contacting the excited additive gas and the source gas. The excitation of the reaction gas can be accomplished in the reactor or upstream of the reactor. As described above, both the source gas and the additive gas can be excited in a remote plasma chamber. Alternatively, the excitation of the reaction gas can be accomplished by exciting the additive gas in a remote plasma chamber and mixing it with the source gas downstream of the remote plasma chamber.

The reaction space comprises a space for heating the reaction gas and a space for exciting the reaction gas and depositing the film. In this embodiment, the reaction gas can be heated in a pre-heat chamber installed upstream of a reactor, the reaction gas is excited in the reactor, and film is deposited on the substrate in the reactor. The source gas and the additive gas can be introduced into the pre-heater chamber. In this case, the reaction space is composed of the interior of the pre-heater chamber, the interior of the reactor, and the interior of the piping connecting the pre-heater chamber and the reactor. Because of using the interior of the pre-heater chamber, the interior of the reactor can be significantly reduced, and thus, the distance between the upper electrode and the lower electrode can be reduced. This leads to not only downsizing the reactor, but also uniformly controlling a plasma over the substrate surface. Any suitable remote plasma chamber and any suitable operation conditions can be used in the present invention. For example, usable are the apparatus and the conditions disclosed in the aforesaid references.

The excitation of the reaction gas comprises exciting the additive gas and contacting the excited additive gas and the source gas. In this embodiment, the additive gas can be excited in a remote plasma chamber, and the source gas is heated in a pre-heater chamber where the excited additive gas and the source gas are in contact, and then the reaction gas flows into the reactor for deposition of a film. In this case, deposition of unwanted particles on a surface of the remote plasma chamber, which causes a failure of ignition or firing, can effectively be avoided, because only the additive gas is present in the remote plasma chamber. The source gas is mixed with the excited additive gas downstream of the remote plasma chamber. The reaction space may be composed of the interior from a point where the excited additive gas and the source gas meet to an entrance to the reactor, and the interior of the reactor.

The plasma reaction is conducted at a temperature of 350-450° C. However, the suitable temperature varies depending on the type of source gas, and one of ordinary skill in the art could readily select the temperature. In the present invention, polymerization includes any polymerization of two or more units or monomers, including oligomerization.

The formation of the insulation film is conducted while maintaining a gas diffusing plate at a temperature of 150° C. or higher (e.g., 150° C. to 500° C., preferably 200° C. to 300° C.), through which the reaction gas flows into the reaction space, so that the reaction is promoted. In the above, the gas diffusing plate (or showerhead) may be equipped with a temperature control device to control the temperature. Conventionally, the temperature of the showerhead is not positively controlled and is normally 140° C. or lower when the temperature of the reaction space is 350-450° C., for example.

The residence time is determined by correlating the dielectric constant with the residence time. This embodiment has been described earlier. The following embodiments also have been described earlier:

The flow of the reaction gas is controlled to render the relative dielectric constant of the insulation film lower than 3.10.

Rt is no less than 140 msec.

It will be understood by those of skill in the art that numerous and various modifications can be made without departing from the spirit of the present invention. Therefore, it should be clearly understood that the forms of the present invention are illustrative only and are not intended to limit the scope of the present invention.

What is claimed is:

1. A method for forming an insulation film on a semiconductor substrate by plasma reaction, comprising:
    vaporizing a silicon-containing hydrocarbon compound to provide a source gas, said silicon-containing hydrocarbon compound comprising a Si—O bond in a molecule;
    introducing a reaction gas comprising the source gas and a carrier gas without a separate oxygen-supplying gas into a reaction space for plasma CVD processing wherein a semiconductor substrate is placed; and
    forming an insulation film constituted by Si, C, O, and H on the substrate by plasma reaction using a combination of low-frequency RF power and high-frequency RF power in the reaction space, wherein the plasma reaction is activated while controlling a flow of the reaction gas to lengthen a residence time, Rt, of the reaction gas in the reaction space, wherein 100 msec$\leq$Rt, $$Rt[s]=9.42\times10^7(Pr \cdot Ts/Ps \cdot Tr)r_w^2 d/F$$

wherein:
    Pr: reaction space pressure (Pa)
    Ps: standard atmospheric pressure (Pa)
    Tr: average temperature of the reaction (K)
    Ts: standard temperature (K)
    $r_w$: radius of the semiconductor substrate (m)
    d: space between the semiconductor substrate and an upper electrode (m) of the reaction space,
    F: total flow volume of the reaction gas (sccm),
    wherein said silicon-containing hydrocarbon compound has the formula $Si_\alpha O_{\alpha-1} R_{2\alpha-\beta+2}(OR')_\beta$ wherein $\alpha$ is an integer of 1-3, $\beta$ is 0, 1, or 2, R is $C_{1-6}$ hydrocarbon attached to Si, and R' is $C_{1-6}$ hydrocarbon unattached to Si, wherein R' is $C_n H_{2n+1}$ wherein n is an integer of 1-3,
    wherein the semiconductor substrate has a via and/or trench wherein the insulation film is formed on a surface of the via and/or trench.

2. The method according to claim 1, wherein said silicon-containing hydrocarbon compound includes a reactive group selected from the group consisting of alkoxy group, vinyl group, amino group, and acid radical.

3. The method according to claim 1, wherein the film has a dielectric constant of 3.3 or less.

4. The method according to claim 1, wherein the carrier gas is selected from the group consisting of He, Ar, Kr, and Xe.

5. The method according to claim 1, further comprising introducing an additive gas selected from the group consisting of an oxidizing gas, $CO_2$, $H_2$, and $C_xH_yO_z$ wherein x=1-5, y=2x or 2x+2, and z=0 or 1, into the reaction space when the source gas is introduced.

6. The method according to claim 5, wherein the additive gas is introduced at a flow rate of 10 sccm to 100 sccm.

7. The method according to claim 1, wherein the low-frequency RF power is 1%-50% of the high-frequency RF power.

8. The method according to claim 1, wherein the low-frequency RF power has a frequency of 2 MHz or less.

9. The method according to claim 1, wherein the high-frequency RF power has a frequency selected from the group consisting of 13.56 MHz, 27 MHz, and 60 MHz.

10. The method according to claim 1, wherein the average temperature of the reaction (Tr) is in a range of 323K to 823K.

11. The method according to claim 1, wherein the insulation film has a density of more than 1.3 g/cm$^3$.

12. The method according to claim 1, wherein the space between the semiconductor substrate and the upper electrode (d) is less than 0.014 m.

13. A method for forming an insulation film on a semiconductor substrate by plasma reaction, comprising:
    vaporizing a silicon-containing hydrocarbon compound to provide a source gas, said silicon-containing hydrocarbon compound comprising a Si—O bond in a molecule;
    introducing a reaction gas comprising the source gas and a carrier gas without a separate oxygen-supplying gas into a reaction space for plasma CVD processing wherein a semiconductor substrate is placed; and
    forming an insulation film constituted by Si, C, O, and H on the substrate by plasma reaction using a combination of low-frequency RF power and high-frequency RF power in the reaction space, wherein the high-frequency RF power is at a higher frequency than the low-frequency RF power, wherein the plasma reaction is activated while controlling a flow of the reaction gas to lengthen a residence time, Rt, of the reaction gas in the reaction space, wherein 100 msec$\leq$Rt, $$Rt[s]=9.42\times10^7(Pr \cdot Ts/Ps \cdot Tr)r_w^2 d/F$$

wherein:
    Pr: reaction space pressure (Pa)
    Ps: standard atmospheric pressure (Pa)
    Tr: average temperature of the reaction (K)
    Ts: standard temperature (K)
    $r_w$: radius of the semiconductor substrate (m)
    d: space between the semiconductor substrate and an upper electrode (m) of the reaction space,
    F: total flow volume of the reaction gas (sccm),
    wherein the carrier gas is selected from the group consisting of He, Ar, Kr, and Xe, wherein the carrier gas is introduced at a flow rate of 10 sccm to 100 sccm, wherein the semiconductor substrate has a via and/or trench wherein the insulation film is formed on a surface of the via and/or trench.

14. A method for forming an insulation film on a semiconductor substrate by plasma reaction, comprising:

vaporizing a silicon-containing hydrocarbon compound to provide a source gas, said silicon-containing hydrocarbon compound comprising a Si—O bond in a molecule;

introducing a reaction gas comprising the source gas and a carrier gas without a separate oxygen-supplying gas into a reaction space for plasma CVD processing wherein a semiconductor substrate is placed; and forming an insulation film constituted by Si, C, O, and H on the substrate by plasma reaction using a combination of low-frequency RF power and high-frequency RF power in the reaction space, wherein the high-frequency RF power is at a higher frequency than the low-frequency RF power, wherein the plasma reaction is activated while controlling a flow of the reaction gas to lengthen a residence time, Rt, of the reaction gas in the reaction space, wherein 100 msec≦Rt, $$Rt[s] = 9.42 \times 10^7 (Pr \cdot Ts/Ps \cdot Tr) r_w^2 d/F$$

wherein:
Pr: reaction space pressure (Pa)
Ps: standard atmospheric pressure (Pa)
Tr: average temperature of the reaction (K)
Ts: standard temperature (K)
$r_w$: radius of the semiconductor substrate (m)
d: space between the semiconductor substrate and an upper electrode (m) of the reaction space,
F: total flow volume of the reaction gas (sccm),
wherein the insulation film is a silicon carbide film doped with oxygen.

15. A method for forming an insulation film on a semiconductor substrate by plasma reaction, comprising:

vaporizing a silicon-containing hydrocarbon compound to provide a source gas, said silicon-containing hydrocarbon compound comprising a Si—O bond in a molecule;

introducing a reaction gas comprising the source gas and a carrier gas without a separate oxygen-supplying gas into a reaction space for plasma CVD processing wherein a semiconductor substrate is placed; and forming an insulation film constituted by Si, C, O, and H on the substrate by plasma reaction using a combination of low-frequency RF power and high-frequency RF power in the reaction space, wherein the high-frequency RF power is at a higher frequency than the low-frequency RF power, wherein the plasma reaction is activated while controlling a flow of the reaction gas to lengthen a residence time, Rt, of the reaction gas in the reaction space, wherein 100 msec≦Rt, $$Rt[s] = 9.42 \times 10^7 (Pr \cdot Ts/Ps \cdot Tr) r_w^2 d/F$$

wherein:
Pr: reaction space pressure (Pa)
Ps: standard atmospheric pressure (Pa)
Tr: average temperature of the reaction (K)
Ts: standard temperature (K)
$r_w$: radius of the semiconductor substrate (m)
d: space between the semiconductor substrate and an upper electrode (m) of the reaction space,
F: total flow volume of the reaction gas (sccm),
wherein the insulation film is composed further of N.

16. A method for forming an insulation film on a semiconductor substrate by plasma reaction, comprising:

vaporizing a silicon-containing hydrocarbon compound to provide a source gas, said silicon-containing hydrocarbon compound comprising a Si—O bond in a molecule;

introducing a reaction gas comprising the source gas and a carrier gas without a separate oxygen-supplying gas into a reaction space for plasma CVD processing wherein a semiconductor substrate is placed; and forming an insulation film constituted by Si, C, O, and H on the substrate by plasma reaction using a combination of low-frequency RF power and high-frequency RF power in the reaction space, wherein the high-frequency RF power is at a higher frequency than the low-frequency RF power, wherein the plasma reaction is activated while controlling a flow of the reaction gas to lengthen a residence time, Rt, of the reaction gas in the reaction space, wherein 100 msec≦Rt, $$Rt[s] = 9.42 \times 10^7 (Pr \cdot Ts/Ps \cdot Tr) r_w^2 d/F$$

wherein:
Pr: reaction space pressure (Pa)
Ps: standard atmospheric pressure (Pa)
Tr: average temperature of the reaction (K)
Ts: standard temperature (K)
$r_w$: radius of the semiconductor substrate (m)
d: space between the semiconductor substrate and an upper electrode (m) of the reaction space,
F: total flow volume of the reaction gas (sccm),
wherein the insulation film is a barrier film for blocking Cu-diffusion.

17. The method according to claim 16, wherein the barrier film has a thickness of 25 nm to 70 nm.

18. A method for forming an insulation film on a semiconductor substrate by plasma reaction, comprising:

vaporizing a silicon-containing hydrocarbon compound to provide a source gas, said silicon-containing hydrocarbon compound comprising a Si—O bond in a molecule;

introducing a reaction gas comprising the source gas and a carrier gas without a separate oxygen-supplying gas into a reaction space for plasma CVD processing wherein a semiconductor substrate is placed; and forming an insulation film constituted by Si, C, O, and H on the substrate by plasma reaction using a combination of low-frequency RF power and high-frequency RF power in the reaction space, wherein the high-frequency RF power is at a higher frequency than the low-frequency RF power, wherein the plasma reaction is activated while controlling a flow of the reaction gas to lengthen a residence time, Rt, of the reaction gas in the reaction space, wherein 100 msec≦Rt, $$Rt[s] = 9.42 \times 10^7 (Pr \cdot Ts/Ps \cdot Tr) r_w^2 d/F$$

wherein:
Pr: reaction space pressure (Pa)
Ps: standard atmospheric pressure (Pa)
Tr: average temperature of the reaction (K)
Ts: standard temperature (K)
$r_w$: radius of the semiconductor substrate (m)
d: space between the semiconductor substrate and an upper electrode (m) of the reaction space,
F: total flow volume of the reaction gas (sccm),
wherein the semiconductor substrate has an exposed Cu layer on which the insulation film is to be formed.

* * * * *

UNITED STATES PATENT AND TRADEMARK OFFICE
CERTIFICATE OF CORRECTION

PATENT NO. : 7,582,575 B2  Page 1 of 1
APPLICATION NO. : 11/294319
DATED : September 1, 2009
INVENTOR(S) : Atsuki Fukazawa et al.

It is certified that error appears in the above-identified patent and that said Letters Patent is hereby corrected as shown below:

On column 1, line 3, after the title, add the heading --CROSS REFERENCE TO RELATED APPLICATIONS--.

On column 6, line 34, change "hexamethydisilane" to --hexamethyldisilane--.

On column 6, line 47, change "CxHyOz" to --$C_xH_yO_z$--.

On column 11, line 17, change "rw" to --$r_w$--.

On column 12, line 47, change "hexamethydisilane" to --hexamethyldisilane--.

On column 18, line 14, Claim 5, change "CxHyOz" to --$C_xH_yO_z$--.

Signed and Sealed this

Sixteenth Day of March, 2010

David J. Kappos
*Director of the United States Patent and Trademark Office*

UNITED STATES PATENT AND TRADEMARK OFFICE
CERTIFICATE OF CORRECTION

PATENT NO.       : 7,582,575 B2                          Page 1 of 1
APPLICATION NO. : 11/294319
DATED            : September 1, 2009
INVENTOR(S)      : Fukazawa et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 662 days.

Signed and Sealed this

Fourteenth Day of September, 2010

David J. Kappos
*Director of the United States Patent and Trademark Office*